United States Patent [19]

Hayakawa et al.

[11] Patent Number: 5,563,840
[45] Date of Patent: Oct. 8, 1996

[54] INTEGRATED SEMICONDUCTOR DEVICE

[75] Inventors: Goro Hayakawa; Yasuhiko Tsukikawa, both of Hyogo, Japan

[73] Assignee: Mitsubishi Denki Kabushiki Kaisha, Tokyo, Japan

[21] Appl. No.: 559,701

[22] Filed: Nov. 15, 1995

[30] Foreign Application Priority Data

Apr. 27, 1995 [JP] Japan ................... 7-103700

[51] Int. Cl.⁶ ........................................ G11C 13/00
[52] U.S. Cl. .................. 365/230.01; 365/230.06
[58] Field of Search ................ 365/230.01, 230.06

[56] References Cited

U.S. PATENT DOCUMENTS 5,473,576  12/1995  Matsui ....................... 365/230.06

*Primary Examiner*—Terrell W. Fears
*Attorney, Agent, or Firm*—Lowe, Price, LeBlanc & Becker

[57] ABSTRACT

When a pad is connected to ground and a mode switching signal MHYP attains an L level, an integrated semiconductor device attains an FP mode. Following the transition of an internal column address strobe signal ZCASF and an internal write enable signal ZWEF to an L level, an NOR gate is opened to allow entry of internal data. When the pad is connected to a power supply potential and the mode selecting signal MHYP attains an H level, the integrated semiconductor device attains an EDO mode. The NOR gate is opened when the internal row address strobe signal ZRASF attains an L level, whereby the external data is entered. The writing operation in an EDO mode can be increased in speed.

3 Claims, 5 Drawing Sheets

INTEGRATED SEMICONDUCTOR DEVICE

BACKGROUND OF THE INVENTION

1. Field of the Invention

The present invention relates to integrated semiconductor devices. More particularly, the present invention relates to an integrated semiconductor device that can switch between an FP (Fast Page) mode and an EDO (Extended Data Output) mode by the so-called bonding option determined by the bonding connection of a pad in a dynamic random access memory (referred to as DRAM hereinafter).

2. Description of the Background Art

FIG. 3 is a block diagram showing an entire structure of a conventional DRAM. Referring to FIG. 3, an externally applied row address strobe signal $\overline{RAS}$ is provided to a $\overline{RAS}$ buffer 1. $\overline{RAS}$ buffer 1 generates an internal $\overline{RAS}$ signal which is provided to an address control circuit 4. In response, address control circuit 4 provides an externally applied row address signal to an address buffer 7. Address buffer 7 provides an X address signal to a row decoder 11, whereby the X address of a memory cell 8 is specified.

Following an entry of row address strobe signal $\overline{RAS}$, a column address strobe signal $\overline{CAS}$ is applied to a $\overline{CAS}$ buffer 2 to be converted into an internal $\overline{CAS}$ signal. The internal $\overline{CAS}$ signal is applied to address control circuit 4, a write control circuit 5, and a readout control circuit 6. Address control circuit 4 responds to the internal $\overline{CAS}$ signal to provide an externally applied column address signal to address buffer 7. In response to a column address signal, address buffer 7 provides an Y address signal to a column decoder 9, whereby the Y address of memory cell 8 is specified. A write enable signal $\overline{WE}$ for identifying read/write is provided to a $\overline{WE}$ buffer 3, whereby an internal $\overline{WE}$ signal is generated. Write control circuit 5 is enabled in response to an L level (logical low) of signal $\overline{WE}$, whereby the data in an input buffer 14 is written into memory cell 8 via a write driver 15. In a readout operation, write enable signal $\overline{WE}$ attains an H level (logical high), whereby readout control circuit 6 activates a pre-amplifier 12 and an output buffer 13. The data in memory cell 8 is read out by a sense amplifier 10 to be output via pre-amplifier 12 and output buffer 13.

In the past several years, the demand for increase in the operation speed in such DRAMs shown in FIG. 3 is appreciated, leading to the development of various operation modes. One such operation mode is the EDO mode. The EDO mode is a faster version of the FP mode. According to a specification in which the time from a rise of a row address strobe signal $\overline{RAS}$ to a data output is tRAC=60 nsec., the cycle time for an EDO mode is 25 nsec., which is drastically higher than the cycle time of 47 nsec. for an FP mode. In order to switch between such modes differing in the required rate by means of the so-called bonding option determined by the manner of connection between the bond and pad in one chip, the operation in an internal circuit must be varied between an EDO mode and an FP mode. More particularly, the specification of the shortest term of an L level of column address strobe signal $\overline{CAS}$ (tCAS) is 15 nsec. in an FP mode in contrast to 10 nsec. in an EDO mode. This is extremely short with respect to a writing operation which is executed only during a period where column address strobe signal $\overline{CAS}$ attains an L level. This will be described in more detail hereinafter.

FIG. 4 is an electrical circuit diagram showing partially the data writing system of a write control circuit, an input buffer, a write driver, and a memory cell of the DRAM of FIG. 3. Referring to FIG. 4, internal row address control signal ZRASF is inverted by an inverter 21 to be applied to one input terminal of an NAND gate 41. An internal column address strobe signal ZCASF is inverted by an inverter 22 to be applied to one input terminal of an NAND gate 42. NAND gates 41 and 42 form an RS flip-flop. An internal write enable signal ZWEF is inverted by an inverter 23 to be applied to one input terminal of an NAND gate 43. The output of inverter 22 and the output of NAND gate 42 are applied to the other input terminals of NAND gate 43. The output of NAND 43 is inverted by an inverter 24 to be provided to an inverter 25 as a CASNW signal. This CASNW signal is further inverted by inverter 25 to be applied to one input terminal of an NOR gate 44. External data EXTDIN is applied to the other input terminal of NOR gate 44. The output of NOR gate 44 is inverted by an inverter 26 to be applied to a transmission gate 50 forming input buffer 14 shown in FIG. 3. In response to an internal latch signal ZDIL, the output of inverter 26 is latched by a latch circuit formed of an inverter 27 and a clocked inverter 51. The latched output is provided as an internal input data signal WDG via inverters 28, 29 and 30 to be applied to a write buffer 60. Write buffer 60 is included in memory cell 8.

Internal input data signal WDG is applied to one input terminal of an NOR gate 46 in write buffer 60 and to an inverter 33. Internal input data signal WDG is inverted by inverter 33 to be applied to one input terminal of an NOR gate 45. A write buffer enable signal WBE is inverted by an inverter 32 to be applied to respective other input terminals of NOR gates 45 and 46. The outputs of NOR gates 45 and 46 are applied to I/O lines IO and ZIO via a write buffer formed of n channel MOS transistors 52–55. I/O line IO is connected to a bit line BL via a transfer gate 56. I/O line ZIO is connected to a bit line ZBL via a transfer gate 57. A chip select signal CSL is applied to the gates of transfer gates 56 and 57.

FIG. 5 is a timing chart for describing the operation of the write circuit of FIG. 4, particularly showing a sufficiently long and short tCAS (the term of the column address strobe signal attaining an L level) of an Early Write cycle (the state of write enable signal WE attaining an L level when column address strobe signal $\overline{CAS}$ is low) in an FP mode.

A writing operation is initiated by column address strobe signal $\overline{CAS}$ and write enable signal $\overline{WE}$ both attaining the L level. Following the fall of internal row address strobe signal ZRASF to an L level as shown in FIG. 5(a), the transition of internal column address strobe signal ZCASF and internal write enable signal ZWEF to an L level as shown in FIG. 5 (b) and (c) causes the output of NAND gate 43 to be pulled down to an L level and then inverted by inverter 24. Signal CASNW attains an H level as shown in FIG. 5 (e), and NOR gate 44 is activated to which external data input EXTDIN is applied. Here, signal WDG attains an H level as shown in FIG. 5 (g) since internal data load signal ZDIL attains an H level as shown in FIG. 5 (f). In response to CASNW attaining an H level, external data input EXTDIN shown in FIG. 5 (d) is transmitted as signal WDG.

Shortly after the data has been entered, internal column address strobe ZCASF and internal write strobe signal ZWEF attaining an L level causes internal data load signal ZDIL shown in FIG. 5 (f) to be pulled down to an L level, whereby the data is latched in input buffer 50. Signal WBE that activates write buffer 60 is also generated from internal column address strobe signal ZCASF and internal write enable signal ZWEF attaining an L level. Signal WBE is pulled up to an H level as shown in FIG. 5 (h) after the transmission of signal WDG, whereby write buffer 60 is activated. Data corresponding to an H level or L level of signal WDG shown in FIG. 5 (g) is written into bit line BL selected by chip select signal CSL.

Signal WBE is a pulse signal taking a constant width when driven to an H level by a self timer. This pulse width must be great enough to reverse the H level and the L level of bit lines BL and ZBL determined by the latch of a sense amplifier (not shown) via an I/O line. However, internal column address strobe signal ZCASF is immediately pulled up to an H level in response to signal WBE driven to an H level during the short term of the tCAS shown in FIG. 5 since the WBE pulse is forcefully disabled by internal column address strobe signal ZCASF. Therefore, write buffer 60 is rendered inactive prior to the inversion of bit lines BL and ZBL, so that data cannot be written.

Although the above-described problem is not encountered in an FP mode in a conventional DRAM since the specification of the tCAS was sufficiently great, this problem is noticeable in the new EDO mode since the specification of the tCAS is extremely reduced therein. A sufficient activation time period of the write buffer cannot be obtained since internal column address strobe signal ZCASF is pulled up to an H level too early.

SUMMARY OF THE INVENTION

In view of the foregoing, an object of the present invention is to provide an integrated semiconductor device that can change the timing of a write buffer initial activation signal to increase speed of a writing operation in an EDO mode.

An integrated semiconductor device according to an aspect of the present invention switching between a first mode of altering the level of a column address strobe signal and a column address signal to write external data into a plurality of memory cells, and a second mode of entering external data immediately after activation of a row address strobe signal. When a signal indicating the first mode is generated from a mode select signal generation circuit, the gate of the first gate circuit is closed. When a signal indicating the second mode is generated, the first gate circuit is opened, whereby a second gate circuit is opened in response to an output signal from the first gate circuit to enter external data.

According to the present invention, the speed of a writing operation in, for example, an EDO mode, can be increased.

In a preferable embodiment, in response to a generation of a signal indicating the second mode from the mode signal generation circuit, a signal for driving the first mode is output from a logic circuit according to a row address strobe signal and a column address strobe signal. An output of the first gate circuit or the logic circuit is applied to the second gate circuit by a third gate circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
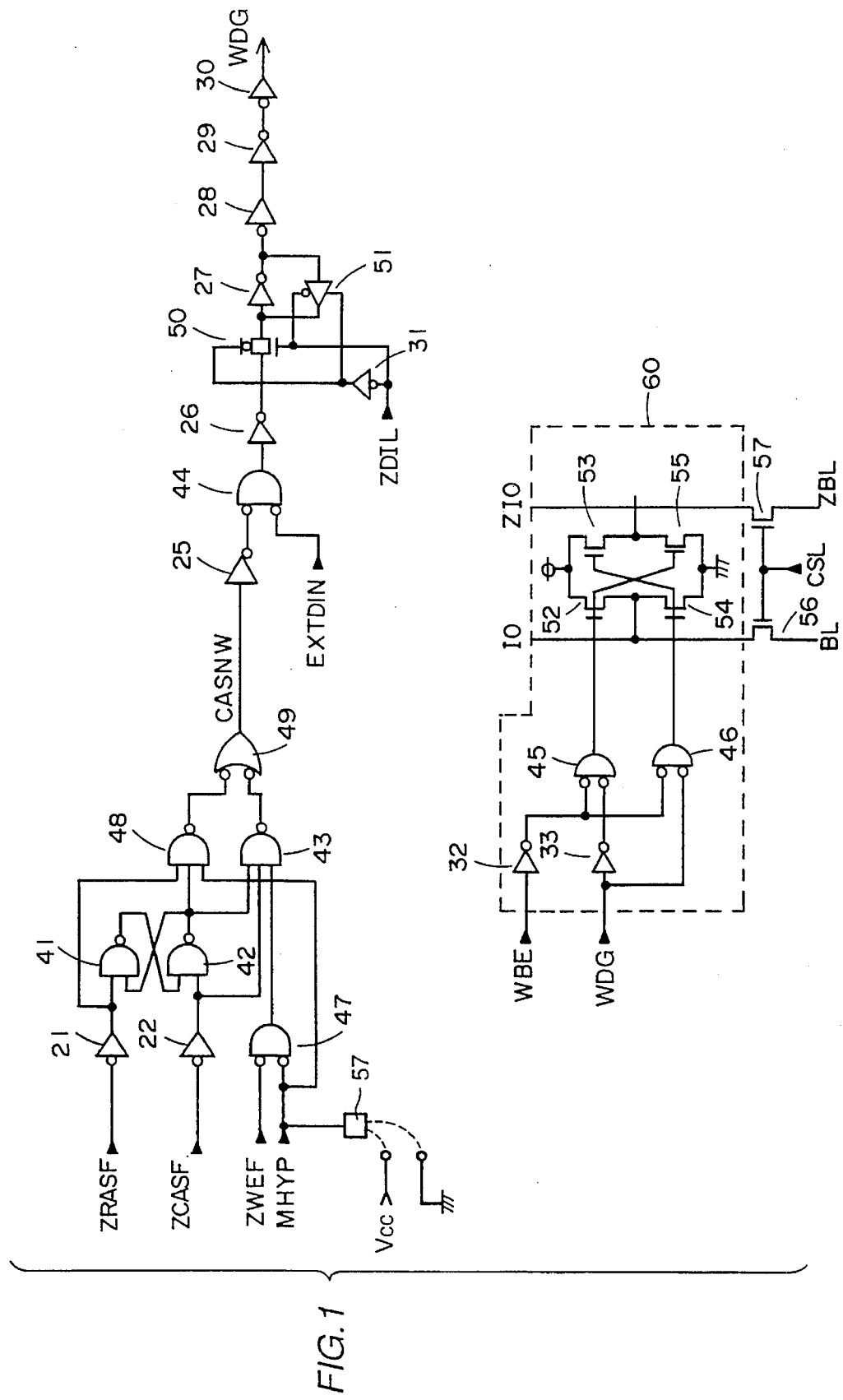
FIG. 1 is an electric circuit diagram according to a first embodiment of the present invention.
Figure 4:
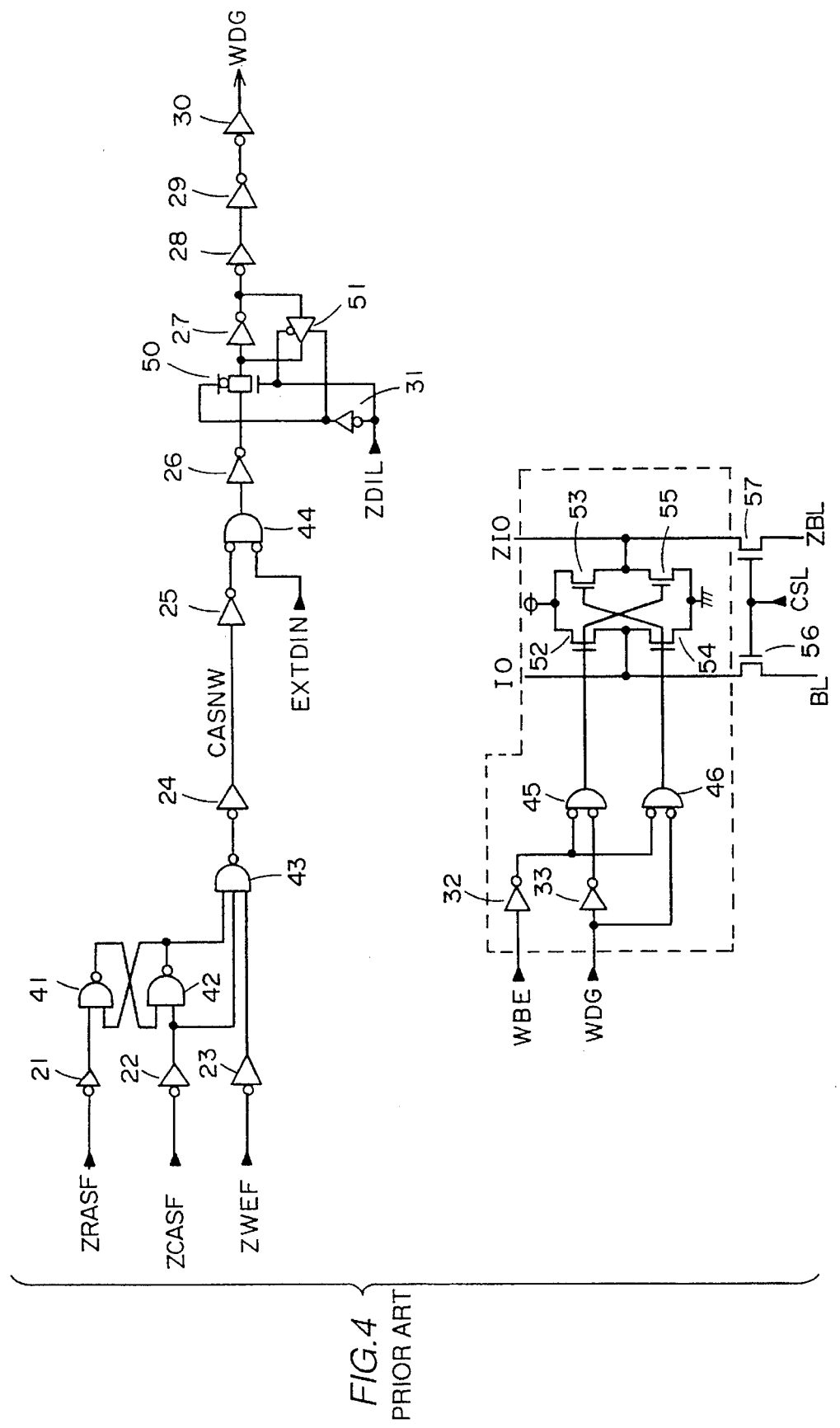
FIG. 4 is an electric circuit diagram specifically showing a write circuit of FIG. 3.

FIG. 1 is a circuit diagram showing a write circuit according to an embodiment of the present invention. The embodiment of FIG. 1 has a structure similar to that shown in FIG. 4 provided that an NOR gate 47 and an OR gate 49 are provided instead of inverters 23 and 24, respectively, and that an NAND gate 48 is additionally provided. NOR gate 47 receives internal write enable signal ZWEF at one input terminal and a mode switching signal MHYP at the other terminal. Mode switching signal MHYP attains an L level at an FP mode and an H level at an EDO mode. This switching is effected by bonding a pad 57 to a power supply line or a ground line. NAND gate 48 receives internal row address strobe signal ZRASF inverted by inverter 21, an output of NAND gate 42, and mode switching signal MHYP at respective input terminals. OR gate 49 receives an output of NAND gate 48 at one input terminal, and an output of NAND gate 43 at the other input terminal.

Figure 2:
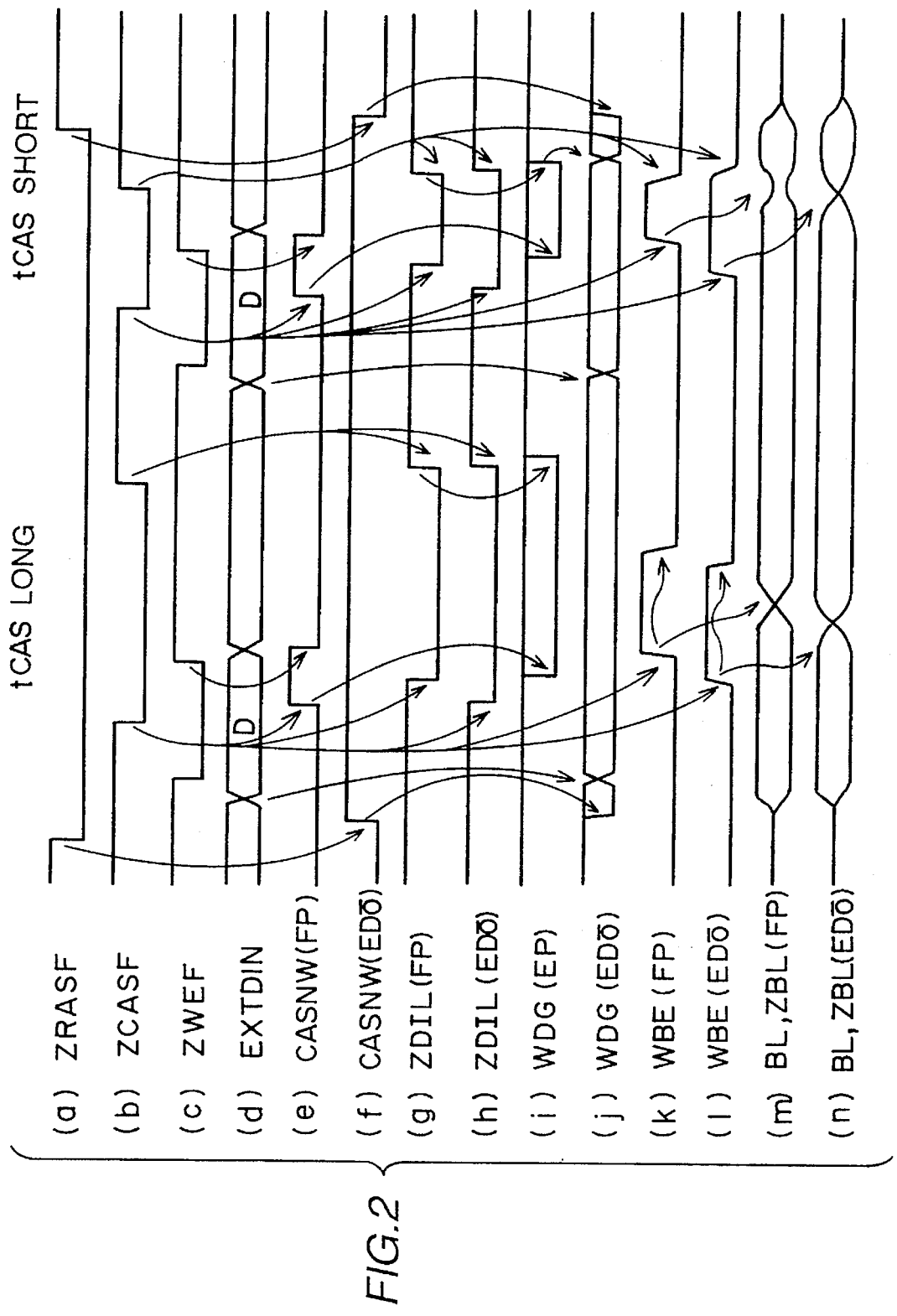
FIG. 2 is a timing chart for describing an operation of the embodiment shown in FIG. 1.
Figure 3:
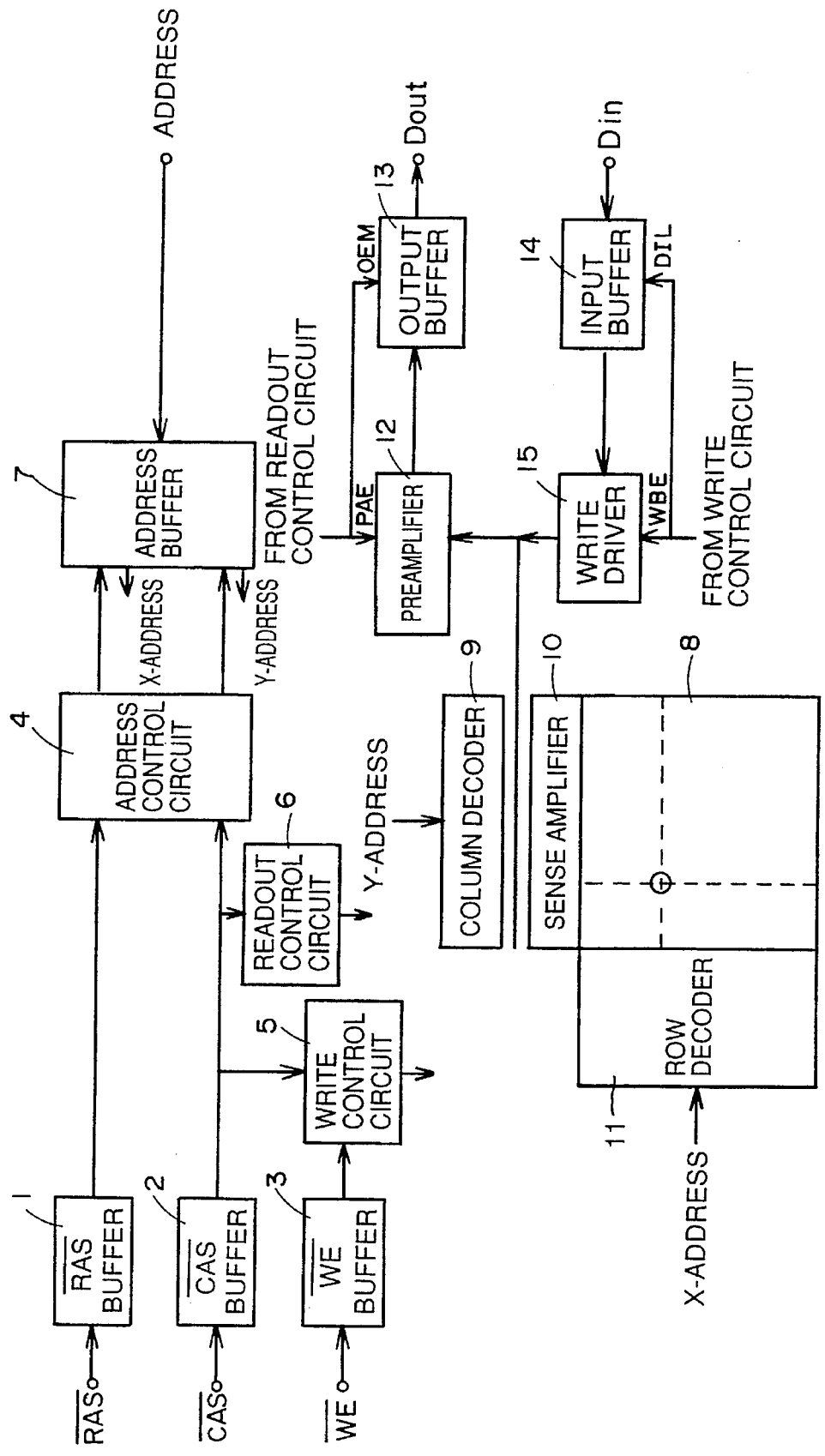
FIG. 3 is a block diagram showing an entire structure of a conventional DRAM.

FIG. 2 is a timing chart for describing an operation of the embodiment shown in FIG. 1.

Figure 5:
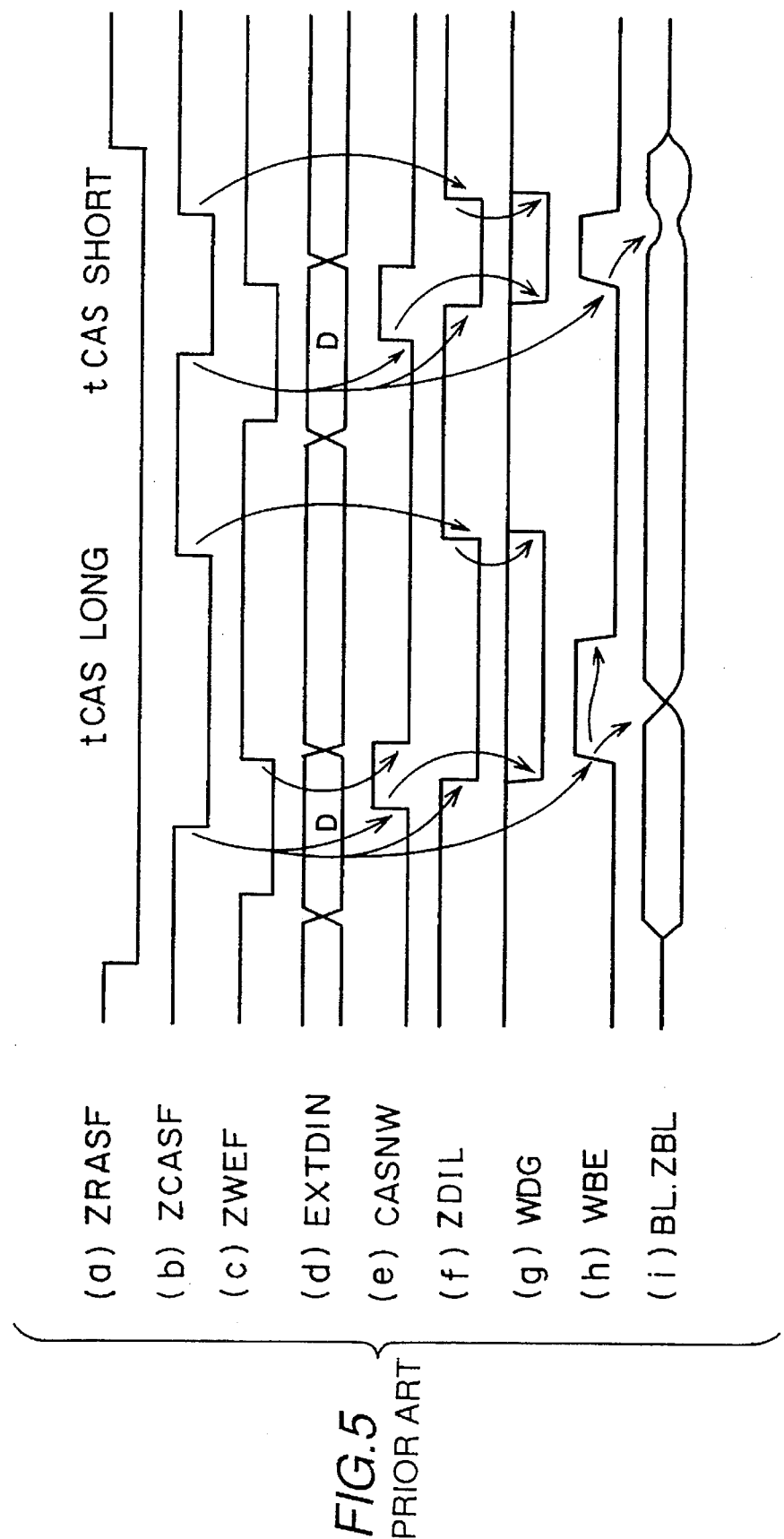
FIG. 5 is a timing chart for describing an operation of the write circuit of FIG. 4.

When mode switching signal MHYP attains an L level, i.e. in an FP mode, NOR gate 47 operates as an inverter, and NAND gate 48 has its gate closed. Therefore, an operation at a timing identical to that of the conventional implement shown in FIG. 4 is carried out. More specifically, a writing operation is initiated when internal column address strobe signal ZCASF attains an L level as shown in FIG. 2 (b). The WBE pulse is driven to an H level by the delay till signal CASNW attains an H level, the delay till external data input EXTDIN is transmitted as signal WDG, and with a margin that suppresses data writing of an inverted WDG signal due to the coincidence of the timing of a rise of the WBE pulse and transition of signal WDG. Since the length of tCAS is sufficient in an FP mode, the timing of a short tCAS shown in FIG. 5 will not be encountered in an FP mode. The output of external data input EXTDIN from NOR gate 44 is inhibited with signal CASNW at all times except when ZCASF=L level and ZWEF=L level. This is to prevent a through current from being conducted to NOR gate 44 since internal data input EXTDIN is connected also to Dout at a normal readout mode and attains a high impedance state.

When mode switching signal MHYP attains an H level, i.e. when in an EDO mode, the tCAS specification is extremely small. As described with reference to FIG. 4, data cannot be written with a circuit similar to that of an FP mode. The operation in an EDO mode is described hereinafter. In response to mode switching signal MHYP attaining an H level, NAND gate 48 is opened, so that internal row address strobe signal ZRASF inverted to an H level by inverter 21 can be constantly received. The output of NAND gate 48 is provided as signal CASNW of an H level via OR gate 49. As a result, when internal column address strobe address ZCASF attains an L level as shown in FIG. 2 (b) and internal write enable signal ZWEF attains an L level as shown in FIG. 2 (c) to initiate a writing operation, the entry of data WDG is advanced since NOR gate 44 is already opened to allow passage of external data input EXTDIN. This means that the activated timing of data latch signal ZDIL shown in FIG. 2(h) and write buffer enable signal WBE shown in FIG. 2(l) is also advanced corresponding to the earlier data entry. Since the rising timing of signal WBE to an H level with respect to the transition of internal column address strobe signal ZCASF to an L level is earlier than that of an FP mode, a sufficient term of the WBE pulse can be obtained even when at the shortest tCAS specification as the tCAS of FIG. 2. Therefore, increase in speed and stabilization of a writing operation can be achieved.

Thus, by changing the data entry timing in a writing operation in response to an FP mode or an EDO mode in a DRAM incorporating both modes in one chip with a bonding option, a stable writing operation and increase in speed can be realized even when the tCAS takes the shortest cycle in an EDO mode.

According to the embodiment of the present invention, a gate is closed when a first level signal is generated, and closed when a second level signal is generated to provide a row address strobe signal. In response to this signal, a gate is opened to allow entry of external data. Therefore, external data can be immediately entered upon activation of a row address strobe signal. The speed of a writing operation in, for example, an EDO mode, can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated semiconductor device switching between a first mode of maintaining an activation state of a row address strobe signal and altering levels of a column address strobe signal and a column address signal to write external data into a plurality of memory cells, and a second mode of entering external data immediately after activation of a row address strobe signal, said integrated semiconductor device comprising:

mode select signal generation means for generating a mode select signal attaining a first level in response to a selection of said first mode and a second level in response to a selection of said second mode, first gate means having a gate closed in response to generation of said first level signal from said mode select signal generation means, and having the gate opened in response to generation of said second level signal to output said row address strobe signal, and second gate means having a gate opened in response to an output signal from said first gate means for receiving said external data.

2. The integrated semiconductor device according to claim 1, further comprising:

logic circuit means responsive to said second level signal generated from said mode select signal generation means for providing a signal to drive said first mode according to said row address strobe signal and said column address strobe signal, and third gate means for applying an output of said first gate means or an output of said logic gate means to said second gate means.

3. The integrated semiconductor device according to claim 2, wherein said logic circuit means comprises a RS flipflop.

* * * * *